(12) United States Patent
Fotouhi

(10) Patent No.: US 6,624,671 B2
(45) Date of Patent: Sep. 23, 2003

(54) WIDE-BAND REPLICA OUTPUT CURRENT SENSING CIRCUIT

(75) Inventor: Bahram Fotouhi, Cupertino, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 10/011,564

(22) Filed: Nov. 5, 2001

(65) Prior Publication Data

US 2002/0093366 A1 Jul. 18, 2002

Related U.S. Application Data

(63) Continuation-in-part of application No. 09/564,254, filed on May 4, 2000, now Pat. No. 6,323,703.

(51) Int. Cl.[7] .................................................. H03B 1/00

(52) U.S. Cl. .................... 327/112; 327/53; 327/309; 327/313; 327/328; 323/315

(58) Field of Search .................................. 327/309, 310, 327/312, 313, 314, 323, 324, 327, 328, 108, 112, 53, 66; 323/312, 313, 314, 315

(56) References Cited

U.S. PATENT DOCUMENTS

| 4,965,510 A | * | 10/1990 | Kriedt et al. | 323/315 |
| 5,087,891 A | * | 2/1992 | Cytera | 330/288 |
| 5,451,860 A | * | 9/1995 | Khayat | 323/314 |
| 6,188,211 B1 | * | 2/2001 | Rincon-Mora et al. | 323/280 |
| 6,323,703 B1 | * | 11/2001 | Fotouhi | 327/112 |

* cited by examiner

Primary Examiner—Timothy P. Callahan
Assistant Examiner—An T. Luu
(74) Attorney, Agent, or Firm—Townsend and Townsend and Crew LLP

(57) ABSTRACT

An indirect current sensing circuit and method for replicating an output current is disclosed. The present invention is capable of preventing device damage and circuit disruption by maintaining output voltage signal integrity and consuming negligible power as well as optimizing output impedance. Furthermore, the indirect current sensing circuit and method is independent of semiconductor process variations and thus is more reliable over prior art current sensing techniques. The indirect current sensing circuit and its method of current limiting and output impedance optimization, according to the present invention, can reliably drive transmission lines in networking system and communication applications.

13 Claims, 10 Drawing Sheets

WIDE-BAND REPLICA OUTPUT CURRENT SENSING CIRCUIT

RELATED APPLICATIONS

This application is a continuation-in-part of commonly-assigned U.S. patent application Ser. No. 09/564,254, now U.S. Pat. No. 6,325,703, entitled "Indirect Current Sensing," by B. Fotouhi, filed May 4, 2000.

BACKGROUND OF THE INVENTION

The present invention relates in general to output drivers within integrated circuits (ICs), and in particular to current limited output driver circuits.

Many electronic devices require protection from the environs in which they operate. When certain physical conditions arise, such as the occurrence of opens in signal conductors or shorts to various power supply buses, the above conditions may impair device operation or even damage the device itself. For example, a power supply circuit designed to provide a specific operational current can be quickly damaged or destroyed if an excessive amount of load current is drawn. Similarly, communication and networking system circuits, such as line drivers and receivers, often encounter similar over-current conditions that may prevent the device from meeting certain interface specifications.

Depending on an electronic device's performance requirements, it is desirable to internally limit current either driven or drawn by the device. Internal current limiting circuitry eliminates the need for providing additional circuitry for external current limiting protection. To this end, output driver circuits have been designed to minimize adverse effects from excessive current when, for example, the output is short-circuited.

In certain applications, such as in networking systems, transceiver devices are used to drive and receive data along transmission lines in accordance with specific networking protocol such as V.28 (RS-232), V.35, RS449, EIA-530-A, X.21, etc. When transmissions lines are driven under load conditions, internally generated voltage levels correspondingly decrease as current is drawn by the load. If over-current conditions arise along the transmission lines, internal voltage levels can be corrupted, resulting in device malfunction. Furthermore, when subject to excessive current conditions, semiconductor structures within a device can be irreparably damaged. Hence, limiting output driver current below a target level is a significant goal in the design of output driver circuits.

A conventional approach senses the current of an output driver transistor directly to determine whether an over-current condition exists. That is, the output current itself is tapped into and is used to monitor over-current events. In a particular output driver circuit, a sensing resistor is placed in series with an output drive transistor to provide for "direct sensing" of the output current. Additionally, an over-current detecting circuit is coupled to the output driver circuit for measuring the voltage drop across the sensing resistor. In operation, when a certain amount of current flows through the sensing resistor, a potential difference develops across the resistor. The monitoring circuitry first compares the potential difference to a reference voltage and then determines whether an over-current condition exists. Upon detection of an over-current condition, the monitoring circuitry disables or "shuts off" the respective output drive transistor. The output current is thus limited by way of direct sensing.

FIG. 1 illustrates a common approach to current limiting output driver circuit 100 by way of directly sensing the output current. Output driver circuit 100 comprises pull-up driver circuit 112, pull-down driver circuit 111, input terminal 102 and output terminal 104. Since both driver circuits are structurally and functionally similar, the following discussion regarding the pull-down driver circuit applies to the pull-up driver as well.

Pull-down driver circuit 111 consists essentially of output drive transistor 106 (e.g., M1), sensing resistor 108 (e.g., R1) and over-current detecting circuit 110. In operation, a signal to be driven is received at input terminal 102 and driven out from output terminal 104. For example, when a relatively high voltage signal, such as +3.3 or +5 volts, is applied to input terminal 102, output drive transistor 106 activates to drive a relatively low voltage signal at output terminal 104. Correspondingly, M1 "sinks" output current ("Iout") 122 into output terminal 104 and through both M1 and R1 to change the output voltage level. If Iout is excessive, then the voltage ($\Delta V$) developing across R1 triggers the over-current detecting circuit to shut down the output driver circuit, thus alleviating the over-current condition.

A significant drawback to this approach is that the sensing resistor, in series with its respective output drive transistor, adversely affects the output signal integrity. To minimize such effects, the voltage drop across the resistor must be limited to a small amount, for example, 100 millivolts. To achieve this minimal voltage drop, the sensing resistor must have a relatively low resistance, such as approximately 1 ohm, or less. Manufacturing such resistors with acceptable accuracy and reliability, however, in present semiconductor processing technologies, such as CMOS, is both difficult and costly. Without reliably precise resistor values, there is a general risk of increased power dissipation associated with the voltage drop across the sensing resistor as well as a disruption in circuit operation due to degraded signal integrity. Signal degradation occurs, for example, when the magnitude of the output voltage swing is diminished due to the voltage drops across R1 and R2. Moreover, the decreased output voltage swings by a driver circuit leads to disruptions in device operation.

Furthermore, in applications requiring relatively high output currents, geometric sizes of both M1 and M2 must be large enough to reduce their output resistances. An increased size in output drive transistors, however, both increases the size of electronic device and limits the functionality of the electronic device.

Therefore, there is a need for a circuit and a method for indirectly sensing current conditions in output driver circuits that is not influenced by semiconductor process variations, that maintains output voltage signal integrity and does not consume more power than is necessary.

SUMMARY OF THE INVENTION

The present invention provides an output driver circuits using an indirect current sensing circuit and technique, wherein semiconductor processing variation effects, signal integrity degradation and power dissipation are minimized. An output driver in accordance to the present invention is designed to operate over a broad range of signal frequencies (i.e., wide-band). Accordingly, in one embodiment, the present invention provides an output driver circuit for driving an output terminal having an output transistor circuit coupled to the output terminal, and a current sensing circuit, wherein the current sensing circuit is configured to replicate proportionately an output current and to sense indirectly an over-current condition. In another embodiment, the current sensing circuit includes an indirect sensing circuit configured to monitor the current condition at the output transistor, and an over-current detecting circuit configured to detect the over-current condition in the indirect sensing circuit. In yet another embodiment, the output transistor circuit further includes a drive limiting circuit configured to alleviate the over-current condition.

A better understanding of the nature and advantages of the present invention may be had with reference to the detailed description and drawings below.

DESCRIPTION OF SPECIFIC EMBODIMENTS

The following detailed description of specific embodiments, including preferred embodiments, reference the accompanying drawings that form part of this disclosure. The drawings illustrate exemplary embodiments and describe how to practice the invention. Without departing from the scope of the present invention, other embodiments may be used in place of those shown and described, and such substitutions should be apparent to one of ordinary skill in the art upon reading this disclosure.

Figure 2:
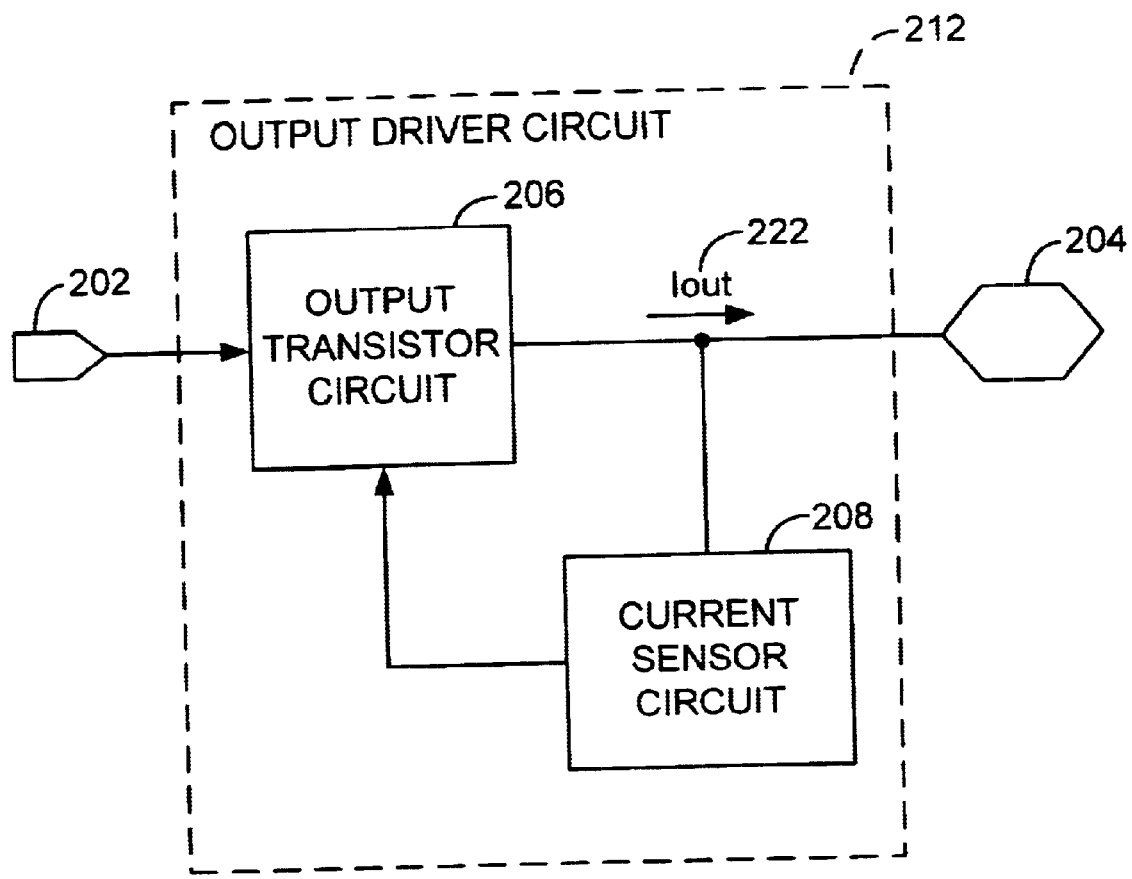
FIG. 2 is a block diagram of an embodiment of an output driver circuit with the current sensing techniques according to the present invention.

In one embodiment of the present invention, an output driver circuit is current limited to a pre-defined level wherein potentially damaging over-current conditions are indirectly sensed and alleviated within the output driver circuit. FIG. 2 shows a simplified block diagram of an exemplary embodiment of current-limited output driver 212 according to the present invention.

The current limited output driver 212 of FIG. 2 includes output transistor circuit 206 and current sensing circuit 208. Output driver circuit 212 has both input terminal 202 and output terminal 204. Current sensing circuit 208 is electrically coupled to both output transistor circuit 206 and output terminal 204 for "indirectly sensing" current conditions at the output terminal.

Figure 1:
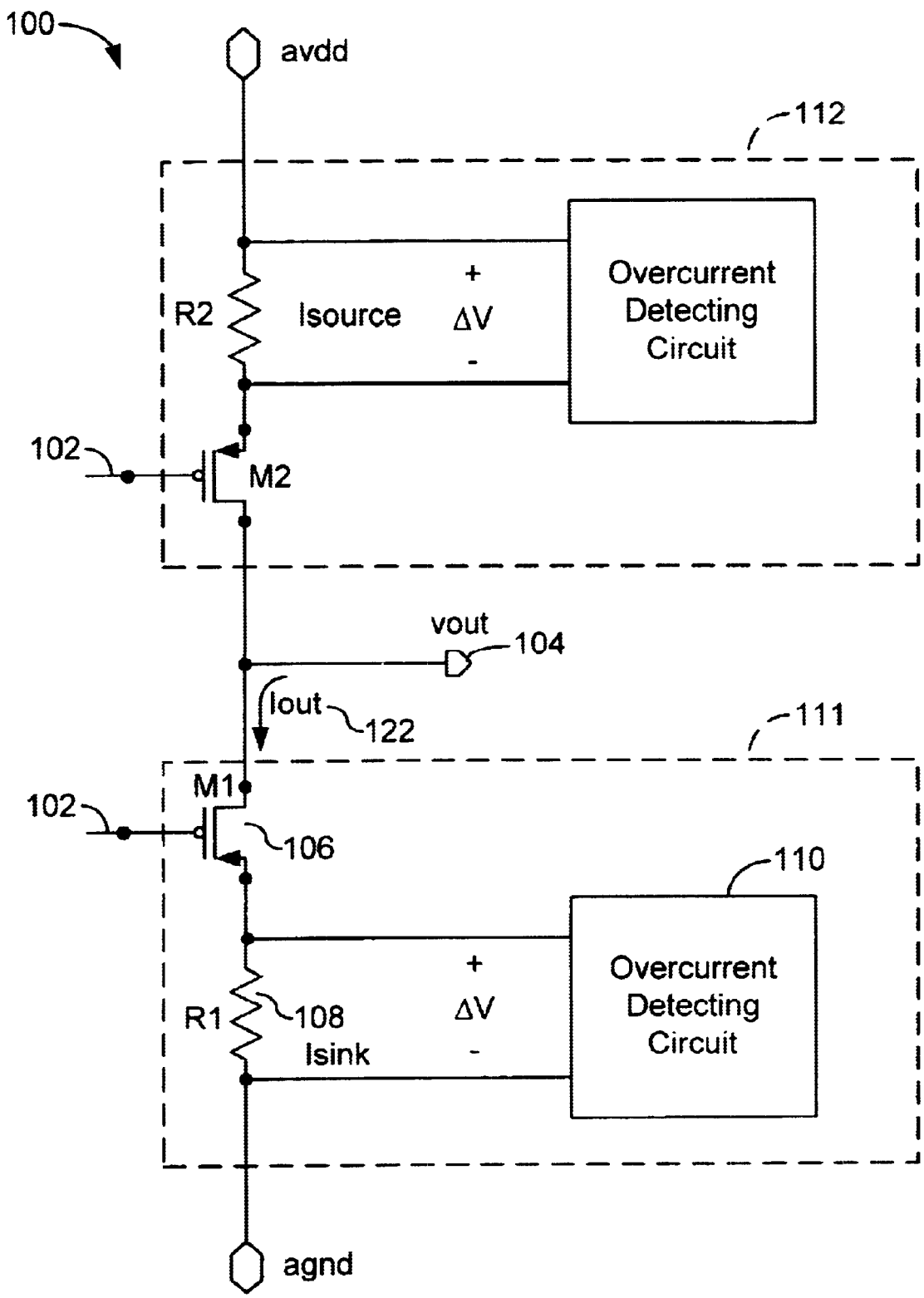
FIG. 1 is a schematic diagram of a prior art circuit for sensing output current.

Unlike the direct current sensing circuit described in FIG. 1, current sensing circuit 208 of the present invention monitors over-current conditions first by generating a replicated current proportional to the output current, and then by determining whether the replicated current itself exceeds a pre-defined current level. Therefore, the invention disclosed herein indirectly senses output current without the drawbacks associated with direct sensing prior art circuits and techniques as described above.

Current sensing circuit 208 is configured further to deliver a signal to output transistor circuit 206 upon detection of an over-current condition. Output transistor circuit 206 contains internal circuitry first to receive the signal indicating the existence of a non-compliant current level, and second, to control driver circuitry to mitigate output over-currents. In one embodiment, output transistor circuit 206 includes a push-pull type amplifier output stage. In another embodiment, the output transistor circuit includes an output stage comprised of a pull up driver, such as a PMOS transistor, and a pull down driver, such as an NMOS transistor.

In operation, output driver circuit 212 receives a signal at its input terminal 202. In turn, output driver circuit 212 drives the received signal out from its output terminal 204 to either another circuit within an integrated circuit ("IC") or to an external environment beyond the IC package in which the output driver resides. In an exemplary application, output driver circuit 212 is used to drive signals along transmission lines and provides sufficient output drive current ("Iout") 222, for example approximately ±150 mA, under various load conditions.

Depending on the signal to be driven, output driver circuit 212 either drives or "sources" current out from output terminal 204 ("Isource"), or alternatively, draws or "sinks" current into output terminal 204 ("Isink"). For example, when output driver circuit 212 is driving a low voltage signal, internal circuitry within the driver circuit causes sufficient current to sink into output terminal 204 to change a previous high voltage state to a low voltage state. The current drawn into the driver generally is held to a minimum amount to change the output voltage level without unnecessary power consumption. An opposite action occurs when output driver circuit 212 is driving a high voltage signal from a previously low voltage state. Although this detailed description of the invention describes an exemplary embodiment using high voltage signals and states, as well as low voltage signal and states, it should be understood that such signal and state levels are relative to each other. In one embodiment, a voltage signal may include high and low logical states, such as a five and zero volts D.C. In another embodiment, a voltage signal to be driven by the present invention may have an intermediate voltage level that is relatively higher than another voltage signal having a lower intermediate voltage level. Such higher intermediate voltage levels are described herein to be a "high voltage" signal. In yet another embodiment, the voltage signals to be driven may be analog as well as digital.

In certain circumstances, however, output driver circuit 212 may be subject to excessive load conditions (i.e., increased load current) wherein the amount of current sourced or sunk by the driver circuit is beyond its nominal operational current level (i.e., "over-current" condition). For example, such circumstances may arise when a resistive short exists between output terminal 204 and either another signal conductor, a voltage supply bus, or a ground potential. When a short couples output terminal 204 to a conductor having an opposite polarity than that being driven by output driver circuit 212, then excessive current is either driven or drawn.

Current sensing circuit 208 of the present invention replicates the output current indirectly sensed from output terminal 204, and then determines whether the replicated current level exceeds pre-defined maximum current limits. If the replicated current level becomes excessive, the present invention correspondingly generates a signal to initiate corrective action. Upon receiving such signal, internal circuitry of output driver circuit 212 functions to limit the excessive output current condition. A detailed explanation of the interaction between indirectly sensed over-current conditions at output terminal 204 and the current limiting circuitry of output driver circuit 212 will be presented below in connection with FIG. 4A.

Figure 3:
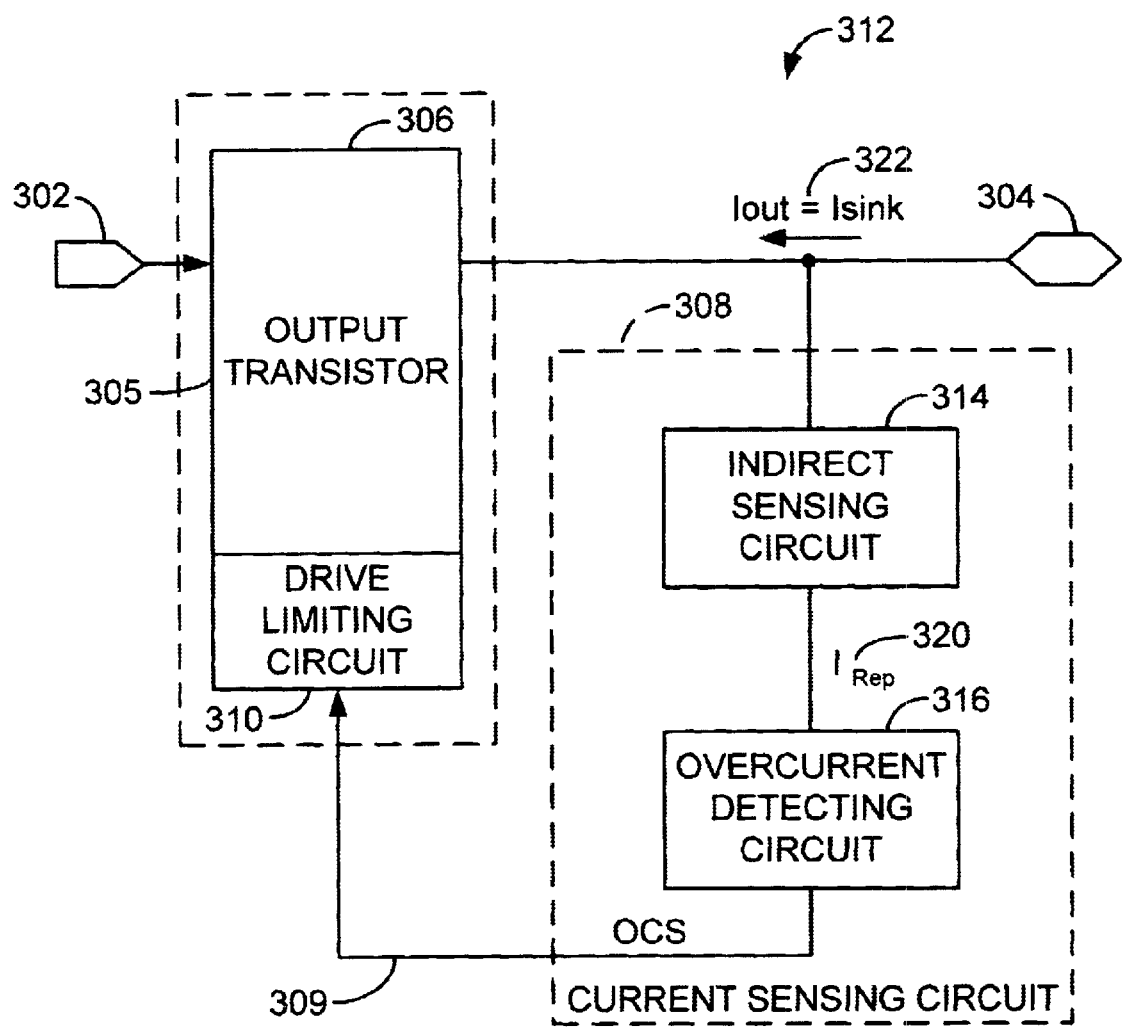
FIG. 3 is a block diagram of an exemplary current sensing circuit according to one embodiment of the present invention.

FIG. 3 is a block diagram showing an exemplary embodiment of output driver circuit 312 of the present invention having output transistor circuit 306 and current sensing circuit 308. Output transistor circuit 306 includes output transistor 305 and drive limiting circuit 310. For example, output transistor 305 is a MOSFET driver that receives a signal to be transmitted at terminal input 302, such as a MOS transistor gate, and correspondingly drives the signal out to output terminal 304 from a MOS transistor drain terminal. In the event that excessive drive current develops at output terminal 304, the associated drive limiting circuit 310, when triggered by over-current signal ("OCS") 309, functions to limit output transistor 305 to curtail the over-current condition.

Current sensing circuit 308 includes indirect sensing circuit 314 and over-current detecting circuit 316. Indirect sensing circuit 314 is configured to first indirectly sense or monitor the current conditions ("Iout") 322 at output terminal 304, and second, to generate a replicated current ("Irep") 320. The input of indirect sensing circuit 314 is a high impedance stage and draws negligible current unlike prior art current limiting techniques. This circuit serves to monitor "indirectly" Iout 322 by comparing the replicated current, rather than Iout, to a pre-defined maximum current level to determine whether an over-current conditions exists at the output terminal. By indirectly sensing Iout, there are no voltage drops across sensing resistors to either dissipate power or affect the signal voltage level. Thus, this inventive circuit consumes substantially less power and preserves output signal integrity.

The output of indirect sensing circuit 314 is coupled to over-current detecting circuit 316 for determining whether an Iout is excessive. Over-current detecting circuit 316 functions to first receive Irep, second to compare Irep to a pre-defined maximum current level ("Iref"), and third to generate a signal ("OCS") 309 flagging the existence of an over-current condition.

Over-current detecting circuit 316 is coupled to output transistor circuit 306 for conveying the existence of a non-compliant current level at output terminal 304. Upon detecting an excessive current condition, over-current detecting circuit 316 outputs OCS 309 which is then received by drive limiting circuit 310 within the output transistor circuit. Drive limiting circuit 310 functions to limit the current in the output transistor 305, thus controlling the maximum current either sourced from or sunk into output driver circuit 312.

In one embodiment, current sensing circuit 308 is coupled between output terminal 304 and drive limiting circuit 310 to detect and to rectify excessive currents "sunk into" output driver circuit 312. Current sensing circuit 308 operates to indirectly monitor currents which excessively "enter" output driver circuit 312. In another embodiment, current sensing circuit 308 is coupled between output terminal 304 and drive limiting circuit 310 to detect and to rectify excessive currents "sourced from" output driver circuit 312. In this embodiment, current sensing circuit 308 operates to indirectly monitor currents which excessively "exit" output driver circuit 312.

Figure 4A:
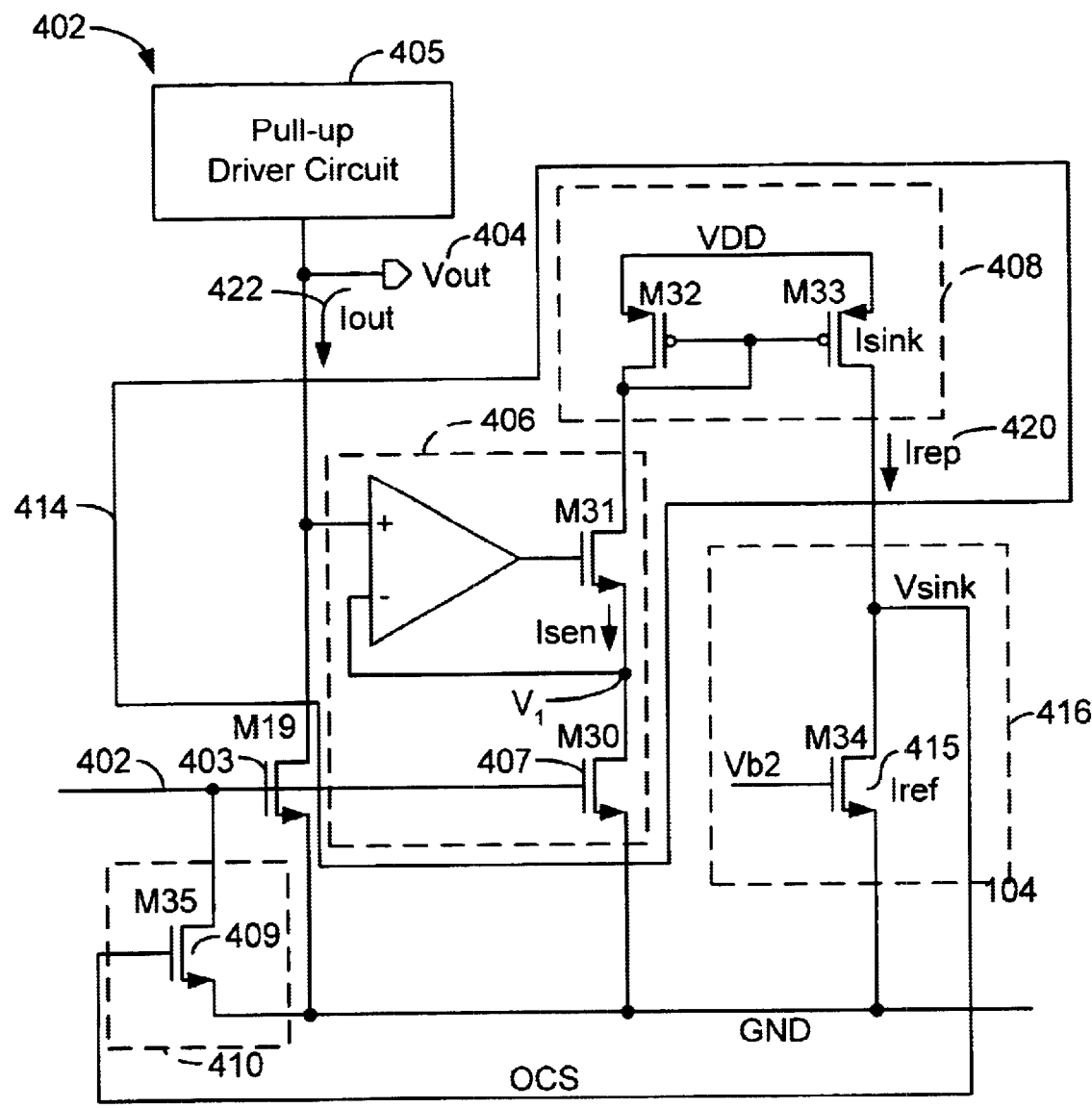
FIG. 4A is a circuit schematic of a first embodiment of an output driver circuit using indirect current sensing circuitry.

FIG. 4A is a diagram showing a specific embodiment of the present invention and describes exemplary output driver circuit 412. One embodiment of output driver circuit 412 includes pull-up driver circuit 405 coupled to both output terminal 404 and to a pull-down driver circuit having output drive transistor 403 (e.g., M19), wherein each driver circuit includes an input 402.

Output driver circuit 412 functions to drive signals received at input terminal 402 out from output terminal 404. For example, if a low voltage signal is applied to input terminal 402, output drive transistor 403 and current sensing circuit 414 are disabled by transistors M19 and M30, respectively. A low voltage signal applied to pull-up driver circuit 405 causes a high voltage signal to be driven out from output terminal 404. Pull-up driver circuit 405 according to the present invention is described in FIG. 5.

A high voltage signal applied to input terminal 402 disables pull-up driver circuit 405. Output drive transistor 403, however, is activated to drive a lower voltage signal at output terminal 404. Additionally, a high voltage signal at the gate of M30 enables current sensing circuit 414 to indirectly monitor Iout 422 by permitting sensed current, Isen, to flow through buffering circuit 406.

In another embodiment, output driver circuit 412 includes current sensing circuit 414 and over-current detecting circuit 416. Current sensing circuit 414 includes buffering circuit 406 having a high impedance sensing input, and current replicating circuit 408 for generating a current proportional to Iout.

Exemplary buffering circuit 406 includes an operational amplifier ("op-amp"), wherein the op-amp's high input impedance provides for the indirect sensing of the Iout 422. In exemplary buffering circuit 406, an op-amp input is coupled to output terminal 404 to monitor Iout 422 indirectly. Another op-amp input is indirectly coupled to the op-amp's output to form a buffering circuit, such as a voltage follower circuit. In another embodiment of buffering circuit 406, the op-amp output is coupled to the gate of a MOSFET (e.g., M31) to modulate the current through the MOSFET corresponding to fluctuations in Iout 422 and operates similar to a voltage-to-current converter. Furthermore, the MOSFET ensures that the current flowing between M32 and M30 (i.e., Isen) does not enter the op-amp's output. In yet another embodiment, the op-amp is configured as a non-inverting op-amp, and in still another embodiment, the op-amp is configured to have unity gain.

Figure 5:
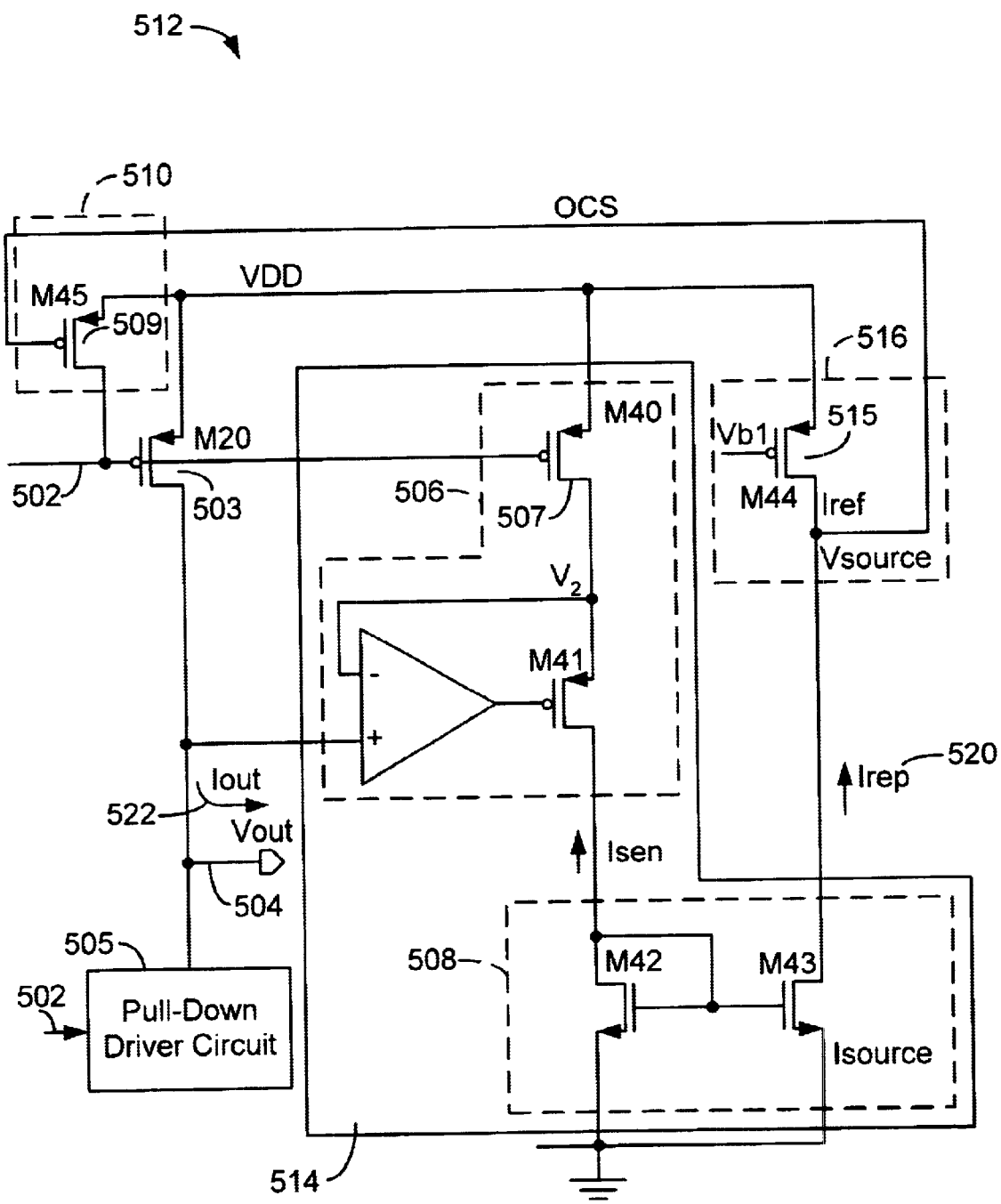
FIG. 5 is a circuit schematic showing second embodiment of an output driver circuit similarly described in accordance with FIG. 4A.

Exemplary buffering circuit 406 also includes sensing transistor 407. Sensing transistor 407 is, for example, a MOSFET having a source, a gate and a drain. The drain of the sensing transistor is coupled to node V1 (or V2 as depicted in FIG. 5), which is also coupled to an op-amp input and to the source of the MOSFET at the op-amp output (e.g., M31). The gate of sensing transistor 407 is coupled to the gate of output drive transistor 403 (e.g. M19) for receiving the signal that is to be driven out through output terminal 404. The source of sensing transistor 407 is coupled to a ground potential, such as zero volts (or to a biased potential, such as Vdd, as depicted in FIG. 5).

In one embodiment of output driver circuit 412, output drive transistor 403 and sensing transistor 407 have different geometric ratios such that Isen is proportional to Iout. For example, Isen flowing through M31 is equivalent to 1/100 of Iout through M19. With the relatively large ratio between M19 and M30, large deviations in Iout is sensed by sensing transistor 407 as a smaller deviation in Isen. In another embodiment, output drive transistor 403 is a short channel device for delivering sufficient drive current Iout at output terminal 404. Short channel devices, such as sensing transistor 407, are able to drive more current than non-short channel devices. Short channel devices, however, are sensitive to variations in Vds and such sensitivity must be accounted for when sensing and replicating Iout.

In operation, buffering circuit 406 functions to buffer over-current detection circuit 416 from the actual output current Iout 422 at output terminal 404. The high impedance input stage of the op-amp provides for sufficient buffering. Furthermore, buffering circuit 406 functions to ensure that Iout is accurately replicated by accounting for Vds sensitivities of output drive transistor 403. In one embodiment, the op-amp in combination with a MOSFET at its output (e.g., M31) provides for accurate replication. This combination ensures that Vds-sensitive output drive transistor 403 and sensing transistor 407 have the same Vds (i.e., Vds19=Vds30). When M19 and M30 have the same Vds, accurate current replication is accomplished. In particular, Isen accurately and proportionately tracks Iout.

FIG. 4A further depicts an illustrative current replicating circuit 408 comprising a current mirror circuit having an input and an output. The current mirror circuit uses Isen to generate a replicated current, Irep, which is proportional to Iout. In one embodiment, the current mirror comprises two MOSFETs (e.g., M32 and M33) wherein the sources of both transistors are coupled to a biased bus of a pre-defined potential, such as Vdd (or ground, as illustrated in FIG. 5). The current mirror input consists essentially of a first MOSFET (e.g., M32) drain coupled to both its own gate as well as to the gate of a second MOSFET (e.g., M33). The output of current replicating circuit 408 consists essentially of the second MOSFET's drain terminal.

Current replicating circuit 408 functions to replicate proportionally the current Isen through buffering circuit 406. First, the circuit receives at its input the sensed current (Isen) from buffering circuit 406. Isen relates to the amount of current contributing to the over-current condition, whether it is identical to or proportional to Iout. Second, the current replicating circuit 408 replicates the sensed current, Isen, and generates another current, Irep, which is proportional to Isen. Third, the current replicating circuit 408 outputs the resultant Irep to over-current detecting circuit 416. Lastly, the detecting circuit determines whether Irep represents a pre-defined over-current condition at output terminal 404.

In one embodiment, the MOSFETs comprising the current mirror circuit (e.g., M32 and M33) have different geometric device properties such that Irep is proportional to Isen. For example, the geometric ratios of the two MOSFETs may be designed such that Irep proportionately is less than Isen. With Irep less than Isen, a relatively lower maximum current level (i.e., Iref) may be set to detect an over-current condition.

Over-current detecting circuit 416 is coupled between the output of current replicating circuit 408 and the input of drive limiting circuit 410. Exemplary over-current detecting circuit 416 includes MOSFET 415 (e.g., M34) wherein its drain is coupled to current replicating circuit 408, its source is coupled to a bus having biased potential, such as Vdd or (ground as shown in FIG. 5), and its gate is biased to a voltage (e.g., Vb2) such that the drain-to-source current ("Ids") of MOSFET 415 is established to be Iref.

In one embodiment, detecting circuit 416 functions to compare Irep to a reference current Iref. In the event Irep exceeds Iref, the detecting circuit 416 generates and outputs a signal indicating an over-current condition (i.e., "Over-current signal," or "OCS"). That is, detecting circuit 416 includes a current comparator wherein Irep is evaluated against generated current Iref. In normal operation, Irep is less than Iref, thus setting Vsink, for example, to ground. As Iout increases, Irep approaches Iref, thus increasing Vsink. Once an over-current condition occurs at output terminal 404, Irep exceeds Iref, thus generating an OCS. The OCS is then sent to drive limiting circuit 409. Drive limiting circuit 409 in turn modulates the gate voltage of output driver transistor 403, thus decreasing Iout.

Figure 4B:
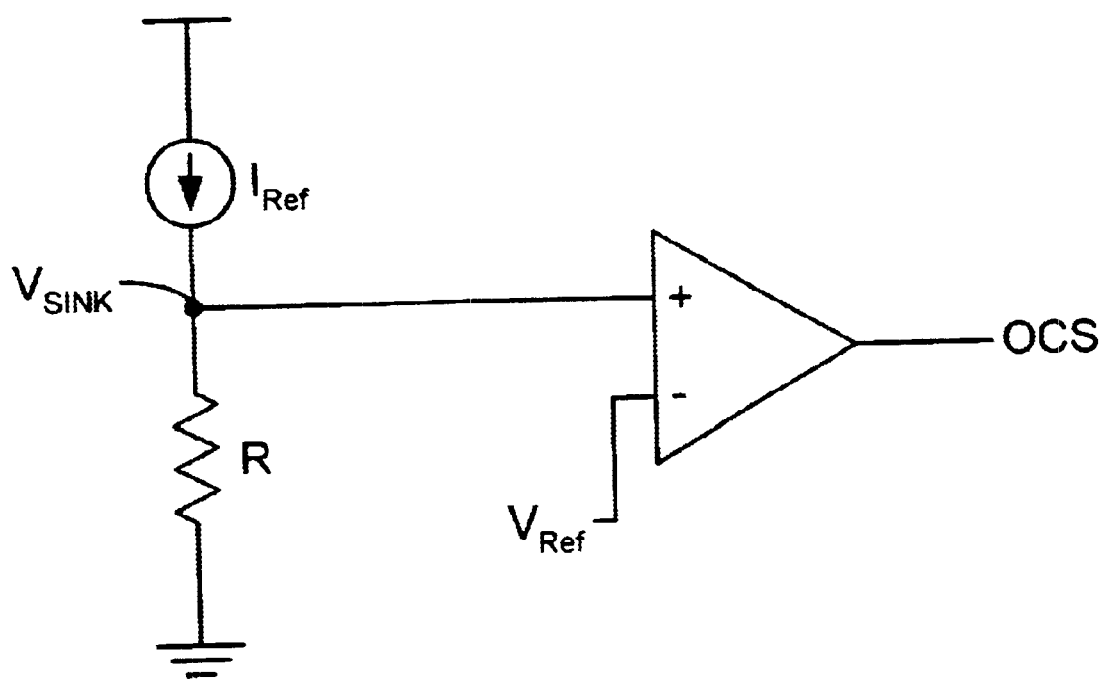
FIG. 4B is a circuit schematic of an exemplary over-current detecting circuit for use with indirect current sensing circuitry.

In another embodiment, Irep generates a voltage, Vsink, which is compared to a reference voltage, Vref, as illustrated in FIG. 4B. For example, generated voltage Vsink is compared to a Vref at their respective inputs into a op-amp comparator circuit. If the op-amp detects Vsink is greater than Vref, an OCS signal would be outputted.

Drive limiting circuit 410 is coupled between the pull-down driver circuit's output drive transistor 403 and the over-current detecting circuit 416. Exemplary drive limiting circuit 410 includes MOSFET 409 wherein its drain is coupled to the input of output drive transistor 403, its source is coupled to a biased bus of a pre-defined potential, such as Vdd (or ground as depicted in FIG. 5), and its gate is coupled to the output of over-current detecting circuit 416.

Upon receiving an OCS signal (i.e., "Vsink") at its input, drive limiting circuit 410 functions to limit the current in the output drive transistor 403. In operation, exemplary drive limiting circuit 410 is configured to receive an over-current signal, OCS. When an over-current condition is detected, the OCS is applied to, for example, the gate of a drive limiting MOSFET. In turn, drive limiting MOSFET 409 (e.g., M35) activates to limit the current in the output drive transistor 403 by pulling the gate voltage to a lower level, such as zero volts, that limits current flow through output drive transistor 403. The above described feedback of OCS to the drive limiting circuit repeats until Irep reaches Iref in equilibrium (i.e., Irep≈Iref). This automatic modulation of the output drive transistor gate voltage therefore acts to alleviate the over-current condition at output terminal 404 by maintaining Iout at peak current (i.e., Iout=Iout(max)).

In yet another embodiment, detecting circuit 416 is not only configured to deliver an OCS to a drive limiting circuit, but is also configured to alert a user of the occurrence of an over-current condition. For example, upon the occurrence of an over-current condition, the OCS is delivered to and stored in a register. The register flags the user that an OCS either has occurred or is occurring. Upon receiving notice of a pending OCS alert, the user is left to perform a user-defined function, such as manually correcting the over-current condition.

FIG. 5 is a diagram showing a specific embodiment of the present invention and describes exemplary output pull-up driver circuit 512. One embodiment of output driver circuit 512 includes pull-down driver circuit 505 coupled to both output terminal 504 and to a pull-up driver circuit having output drive transistor 503 (e.g., M20), wherein each driver circuit includes an input 502.

Output driver circuit 512 functions to drive signals at received input terminal 502 out from output terminal 504. For example, if a high voltage signal is applied to input terminal 502, output drive transistor 503 and current sensing circuit 514 are disabled by transistors M20 and M40, respectively. A high voltage applied to pull-down driver circuit 505 causes a low voltage signal to be driven out from output terminal 504. Pull-down driver circuit 505 according to the present invention is described in FIG. 4A.

A low voltage signal applied to input terminal 502 limits pull-down driver circuit 505. Output drive transistor 503, however, is activated to drive a logical high voltage at output terminal 504. Additionally, a low voltage signal at the gate of M40 enables inventive current sensing circuit 514 to monitor Iout 522 indirectly by permitting sensed current, Isen, to flow through buffering circuit 506.

In another embodiment, output driver circuit 512 includes current sensing circuit 514 and over-current detecting circuit 516, in which both are structurally and operationally similar to current sensing circuit 414 and over-current detecting circuit 416, respectively, as depicted in FIG. 4A. Similar to the detecting circuit in FIG. 4A, detecting circuit 516 of FIG. 5 includes MOSFET 515 (e.g., M44) with its gate biased to a voltage (e.g., Vb1) for generating Iref.

Drive limiting circuit 510, which includes MOSFET 509 (e.g., M45), is coupled between the pull-up driver circuit's output drive transistor 503 and the over-current detecting circuit 516. Exemplary drive limiting circuit 510 is structurally and operationally similar to drive limiting circuit 410, as depicted in FIG. 4A. Drive limiting circuit 510 operates to limit the current of the output drive transistor 503 by pulling the gate voltage to a higher level which then limits the current flow through output drive transistor 503. Therefore, the over-current condition at output terminal 504 is thus alleviated by maintaining Iout at is maximum allowable peak current, Iout (max).

Figure 6:
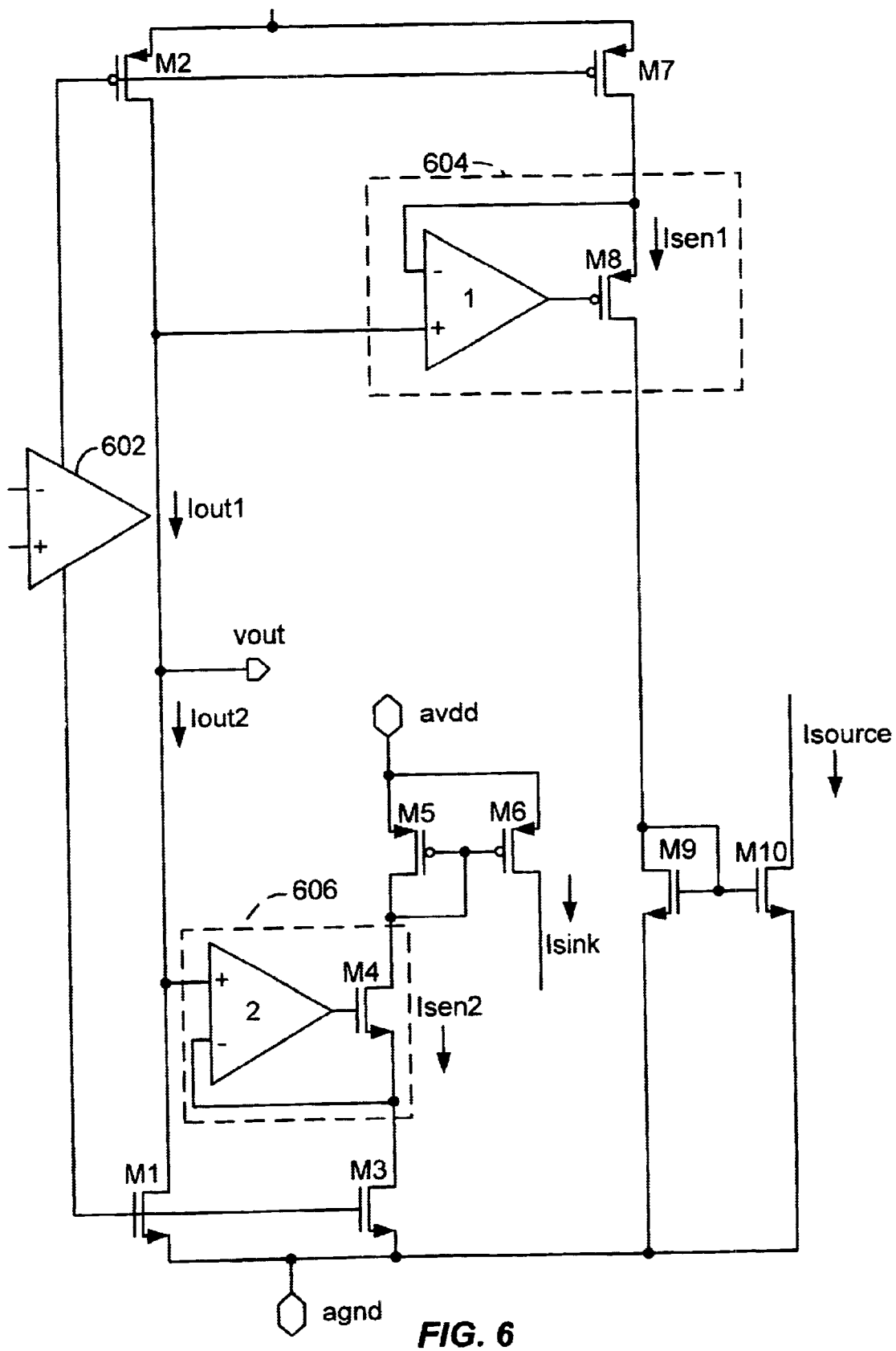
FIG. 6 is a circuit schematic showing indirect current sensing circuitry from both FIGS. 4A and 5 without over-current detecting or drive limiting circuitry.

FIG. 6 is a circuit schematic showing indirect current sensing circuitry similar to circuitry depicted in both FIGS. 4A and 5, but omits the over-current detecting and drive limiting circuits. Such a circuit is suitable in other applications other than limiting output current. For example, indirect current sensing circuitry of FIG. 6 may also be used to adjust or optimize output impedance of an output driver stage. Adjustments in output impedance is done by using current feedback techniques discussed below. An example of the indirect current sensing circuit of FIG. 6 shows an operational amplifier 602 having an output stage with two buffering circuits 604 and 606, but without either an over-current detecting or drive limiting circuit.

Figure 7:
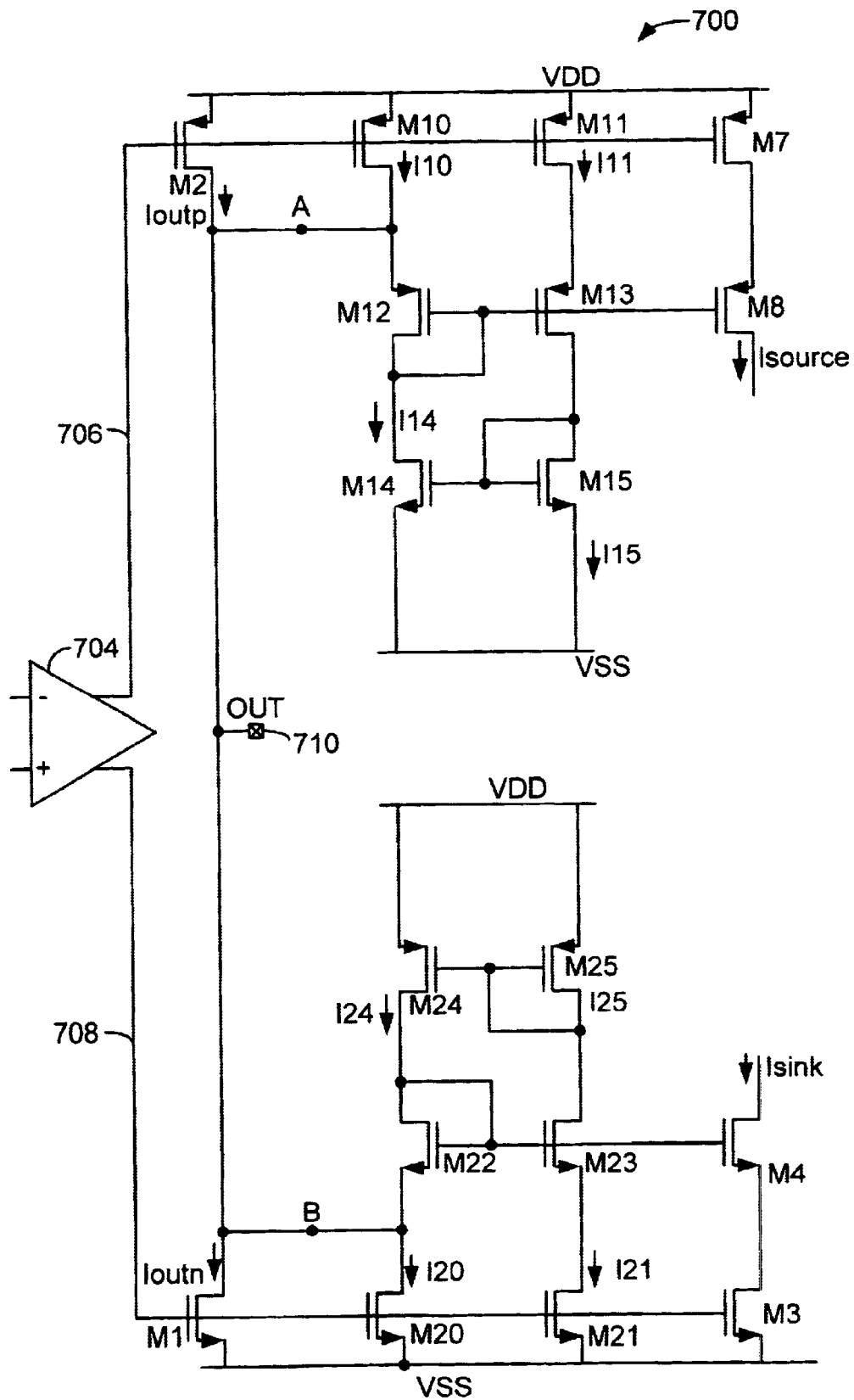
FIG. 7 is a circuit schematic of a third embodiment of the present invention.

FIG. 7 depicts yet another embodiment of the present invention, where the buffering circuits 604 and 606 of FIG. 6 are not implemented in performing indirect current sensing. That is, neither buffering circuit 406 of FIG. 4A nor buffering circuit 506 of FIG. 5, for example, is used in accordance with this embodiment of the present invention.

An exemplary indirect sensing current circuit shown in FIG. 7 is shown coupled to an operational amplifier 704 having at least two output terminals. Output terminal 706 and output terminal 708 are configured to provide respective drive voltages to a p channel transistor and an n channel transistor. As shown, terminals 706 and 708 are coupled to the gates of transistor M2 and transistor M1, respectively. In this example, M2 and M1 are designed to be output driver transistors of the operational amplifier 704. terminal 706 is also coupled to the gates of M10, M11, and M7, and terminal 708 is also coupled to the gates of M20, M21, and M3. M7 and M3 are transistors designed to replicate currents associated with devices M2 and M1, respectively. That is, M7 replicates an indirectly sensed current I10, that flows through M10. M7 operates to generate the replicated current Isource in accordance to the sensed current I10 where I10 is related to the output current Ioutp flowing through M2. Similarly, M3 replicates an indirectly sensed output current, Ioutn, that flows through M1. M3 functions to provide the replicated current Isink in accordance to the sensed current I20 where I20 is related to the output current Ioutn. Although indirect current sensing circuit 700 is depicted as external to symbolic representation of operational amplifier 704, it should be understood that indirect current sensing circuit 700 is integrated into the same integrated circuit, such as the operational amplifier 704.

In this example, M2 and M7 are designed to have different geometric ratios such that Isource is proportional to Ioutp by a factor of their geometric ratios (i.e., M7 to M2). To minimize currents I10, I11, and I7, the respective devices are designed to be identical, where each transistor M7, M10 and M11 might be designed to be, for example, $\frac{1}{300}^{th}$ or $\frac{1}{400}^{th}$ of the size of M2. One having ordinary skill in the art should appreciate, however, that M1, M11 and M7 need not be exactly identical to practice the present invention.

In operation, the output voltage applied to terminal 706 is used to control the at least four p-channel output devices M2, M1, M11 and M7, where the p-channel devices are capable of sourcing currents. Similarly, the output voltage applied to terminal 708 is used to control the at least four n-channel output devices M1, M20, M21 and M3, where the n-channel devices are capable of sinking currents.

Output drive transistor M2 has its source coupled to a biased potential, such as Vdd, and its drain terminal is coupled to an output node 710. Similarly, output drive transistor M1 has its source coupled to a biased potential, such as Vss, and its drain terminal is coupled to an output node 710. Also, the source terminals of devices M10, M11, M7 are coupled to biased potential, such as Vdd, and the source terminals of devices M20, M21, M3 are coupled to biased potential, such as Vss.

The drain terminals of M2 and M10 are coupled together at node A and the drain terminals of M1 and M20 are coupled together at node B. Both nodes A and B are designed to be "virtual short circuits" between the device drain terminals of M2 and M10 and M1 and M20, respectively. More specifically, the nodes are described as virtual short circuits because although the drain terminals are coupled together at a node, the circuit is designed such that no current will flow through nodes A and B (i.e., the net current flow is zero or negligible).

Transistors M12 and M13 form a first current mirror circuit. The current mirror circuit formed by using M12 and M13 to mirror the duplicate sensed current I11 into M14. Current I14, which flows through M14, is substantially equal in magnitude to the indirectly sensed current I10. With M10 and M11 designed to be equivalent sized transistors, the duplicate sensed current I11 will be equal in magnitude as indirectly sensed current I10 (i.e., I10=I11). Current I10 is described herein as indirectly sensed current because the output current itself is not tapped into (e.g., because of the use of virtual short circuits) to monitor current conditions and levels at output node 710.

Structurally, the source terminals of M12 and M13 are coupled to drain terminals M10 and M11, respectively. The gate terminals for M12 and M13 are coupled to a common gate that is further coupled to the gate of M8. The source terminal of M8 is coupled to the drain terminal of M7 and the drain terminal of M8 is configured to provide Isource. M8 functions to ensure that the drain terminal of M7 is at a proper voltage for generating replicated current Isource. In this example, each of the transistors M12, M13 and M8 are p-channel transistors designed to have similar geometric ratios.

Transistors M14 and M15 are used to form a second current mirror circuit. The current mirror circuit is formed using M14 and M15 to mirror the current I14 into M14. With transistors M10 and M11 equally sized (i.e., currents I10 and I11 are equal), then the current I15 flowing through M15 is equal to I14. Current I15 functions, in part, to ensure that the current I11 flowing into M13 is the same as the current I15 flowing out of M13. M11, M13 and M15 operate to equalize the current (e.g., I10) flowing into the virtual short circuit at node A and the current (e.g., I14) flowing from the virtual short circuit at node A.

Structurally, the drain terminals of M14 and M15 are coupled to the drain terminals of M12 and M13, respectively. The gate terminals for M14 and M15 are coupled to a common gate. The source terminals of M14 and M15 are coupled to a biased potential, such as Vss. In this example, both transistors M14 and M15 are n-channel transistors designed to have similar geometric ratios.

As shown in FIG. 7, M12 and M15 are diode-connected transistors. The diode-connected transistor M12 configuration (i.e., M12 gate is coupled to its drain), for example, is designed to bias the gates of M13 and M8. That is, the diode-connected transistor M12 biases the common gate at one Vgs below the output voltage level, Vout, at output node 710.

In operation, the gate-to-source voltage ("Vgs") of M2 is equivalent to Vgs of M10, and the drain-to-source voltage ("Vds") of M2 is equivalent to Vds of M10. Thus, the current I10 sourced from M10 will be proportional to the current Ioutp through M2 by a factor of their geometric size ratios.

M10 operates as a current generator designed to source or push current I10 into node A and M14 operates as a current generator designed to sink or pull current I14 from node A through M12. With I10 equal to I14, node A will have no net current flowing through it, and thus is a virtual short circuit.

With the current I12 flowing through M12 equal to the current I13 flowing through M13, the gate-to-source voltages of M12 and M13 will track each other. Additionally, the gate-to-source voltage of M8 will track the Vgs of M12 and M13. Similarly, M12, M13 and M8 will have equal currents and each of their source terminals will be substantially at the same voltage as the output voltage level at node 710.

With M8, M12, and M13 matching each other, these transistors operate to force the drains of M10 M11 and M7 to be at equivalent voltages. Consequently, the voltages at the drain and gate of M7 will replicate the voltages at the drain and gate of M2, respectively. And since, the sources of M12, M13 and M8 all track each other, then current Isource through M7 will track the current Ioutp through M2. Thus, Isource is a replicated current whose magnitude is proportional to current Ioutp.

If Ioutp increases due to an increase in current to drive a load, for example, then the Vgs of M2 increases. Correspondingly, the Vgs of M10 also increases. With each Vds of M2 and M10 being equal, then current I10 will increase proportionately with the increase in current Ioutp by a ratio of M10 to M2. Current I14 will follow and will correspondingly increase equally with I10. Thus, node A remains a virtual short circuit and Isource will increase proportionally with respect to Ioutp.

Although the above description of FIG. 7 relates to the pull-up drive circuit relating to output driver M2, it should be apparent that the above description also applies to the indirect sensing circuit related to output driver M1.

Figure 8:
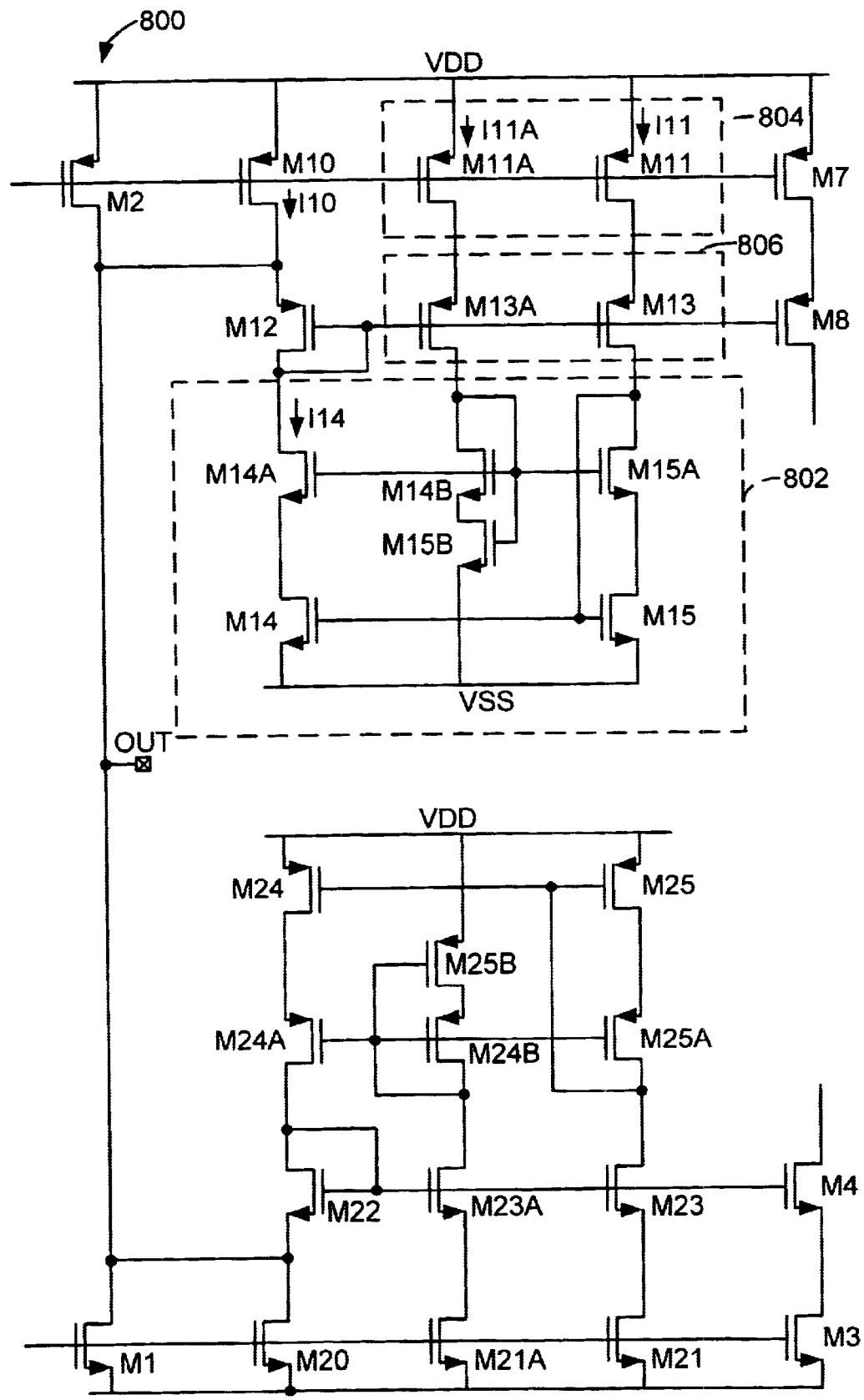
FIG. 8 is circuit schematic of a fourth embodiment of the present invention.

FIG. 8 depicts an alternate embodiment of the present invention. Indirect sensing circuit 800 includes cascode current mirrors to better match I14 with I10. Such a cascode current mirror is implemented to replace a simple current mirror, such as the combination of M14 and M15 transistors.

To better match I14 and I10, I10 and I11 are designed to be nearly equivalent to each other byequalizing, for example, the drain-to-source voltages of M12 and M13. As shown in FIG. 8, exemplary indirect sensing circuit 800 is designed to minimize the effects of possibly different drain-to-source voltages of the transistors shown in FIG. 7.

Referring back to FIG. 8, FIG. 7's simple current mirror circuit of M14 and M15 is replaced by an exemplary alternate current mirror circuit 802. Additionally, FIG. 7's M11 and M13 are replaced by transistor circuits 804 and 806, respectively.

Figure 9:
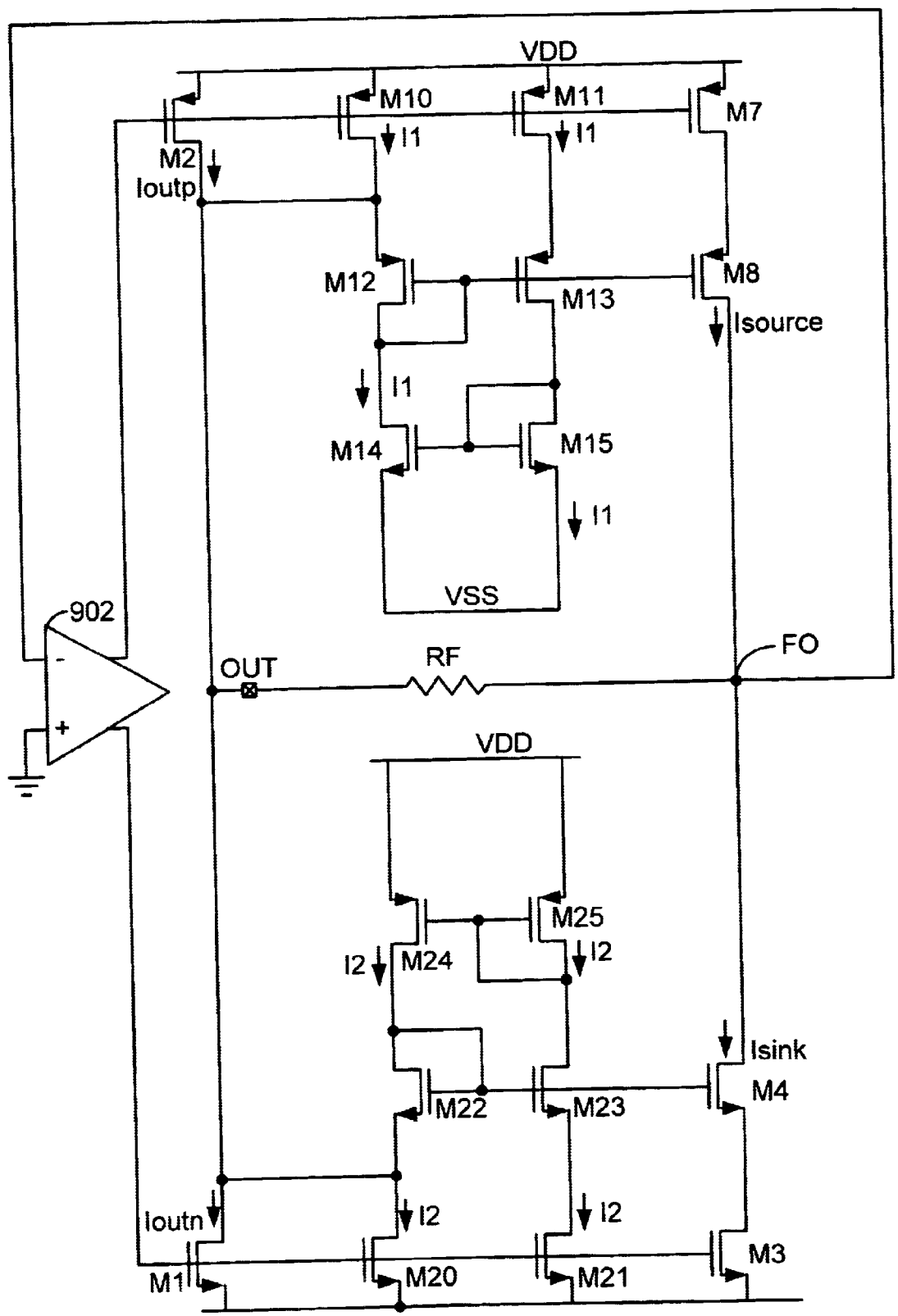
FIG. 9 is circuit schematic of an embodiment of the present invention configured to determine output impedance.

FIG. 9 depicts an operational amplifier according to still yet another embodiment of the present invention. Operational amplifier 902 includes output drive transistors M1 and M2 for providing an output voltage and drive current. In this embodiment, an exemplary indirect sensing circuit is used to adjust the output resistance of the operational amplifier's output stage by, for example, programming the feedback current.

In this example, the positive input of the operational amplifier is coupled to a biased level, such as either ground or to a predetermined potential (not shown). A feedback resistor Rf is coupled from the output terminal of the operational amplifier and to the negative input of the operational amplifier, thus providing for a current feedback loop. As shown in FIG. 9, the drains of M8 and M4 are also coupled to the negative operational output at Node FO ("Feedback Output").

In operation, a fraction of the output current (i.e., Isource) from the feedback output at node FO output terminal is forced to flow though Rf into the output terminal of the operational amplifier. The output impedance is determined within the tolerances of Rf, where Rf represents on-chip resistance of other circuitry. An acceptable tolerance of Rf is, for example, a ten percent.

To determine output impedance, a current generator (not shown) is coupled from Vss to the negative input at node FO, wherein a voltage is generated at Vout. The polarity of current is determined on whether p-channel or n-channel transistors make up the output resistance (i.e., are active in determining output impedance). When the applied current drives the load Rf from the current generator, the feedback circuit senses current into the load and feeds back a fraction of the current into Rf. Thereafter, the output impedance is determined, for example, asRf/(1+B), where in this example B (beta ratio) is equal to the ratio of M2 to M7. Where Rf is known and by adjusting the B, then the output impedance can be optimized for different applications. For example, if a T1 line is to be driven by the output drivers, then an optimum output resistance might be adjusted to 100 ohms to match the load of an output line for maximum power transfer.

In an exemplary application, a integrated circuit including an operational amplifier according to the present invention may have an output stage configured to program one of more possible resistances which are appropriate for respective applications. For example, a register in the integrated circuit may be configured such that each bit of the register is associated with a different output resistance. If a particular bit is set, an output resistance associated with the set bit will be used to program the user's desired output resistance. The programmed resistance thus provides for optimized device operation in a particular application. In some exemplary operational applications, the output impedance may be programmable from 0 to 100 ohms, for example, in any number of steps.

To implement an exemplary programmable output resistance to the present invention, one or more combinations of M7 and M8 structures may be implemented in parallel with the M7 and M8 shown in FIG. 9, where each gate of M7 and M8 in parallel are coupled commonly. Each parallel structure of M7 and M8 may have differing geometric ratios such that the appropriate output resistance may be obtained by selecting the most appropriate M7 and M8 combination.

In summary, a novel output driver circuit with indirect over-current sensing and method of indirect current sensing has been invented and is described herein. The indirect current sensing circuit according to the several embodiments described herein may applied to current limiting, output impedance adjustment or any other application that may benefit from employing indirect current sensing circuit techniques of the present invention. The inventive indirect over-current sensing approach neither affects the output signal integrity nor consumes more power than is necessary.

The above description is illustrative and not restrictive. Many variations of the invention will become apparent to those of skill in the art upon review of this disclosure. For example, the indirect over-current sensing circuit may be configured to operate with input drivers or other integrated circuits where current limiting or output impedance optimization is desired. Additionally, the indirect over-current sensing circuit and method may be implemented with other semiconductor technologies and devices, such as bipolar transistors. The scope of the invention should, therefore, be determined not with reference to the above description, but instead should be determined with reference to the appended claims along with their full scope of equivalents.

What is claimed is:

1. An output driver circuit to drive a signal out from an output terminal, the output driver circuit having an input configured to receive the signal and an output configured to drive the signal to the output terminal, the output driver circuit comprising:
   a first MOSFET having a first gate terminal configured to receive the signal, a first source terminal coupled to a first potential and a first drain terminal coupled to the output terminal;
   a second MOSFET having a second gate terminal coupled to the first gate terminal, a second source terminal coupled to the first potential and a second drain terminal coupled to the output terminal;
   a third MOSFET having a third source terminal coupled to the output terminal and a third gate terminal of the third MOSFET coupled to a third drain terminal;
   a fourth MOSFET having a fourth gate terminal coupled to the first gate terminal and a fourth source terminal coupled to the first potential;
   a fifth MOSFET having a fifth gate terminal coupled to the third gate terminal and a fifth source terminal coupled to a fourth drain terminal;
   a sixth MOSFET having a sixth drain terminal coupled to the third drain terminal and a sixth source terminal coupled to a second potential;
   a seventh MOSFET having a seventh gate terminal coupled to a sixth gate terminal, a seventh source terminal coupled to the second potential, and a seventh drain terminal coupled to a fifth drain terminal of the fifth MOSFET, wherein the seventh gate terminal is coupled to the seventh drain terminal;
   an eighth MOSFET having an eighth source terminal coupled to the first potential and an eighth gate terminal coupled to the first gate terminal; and
   a ninth MOSFET having a ninth source terminal coupled to an eighth drain terminal,
   wherein the ninth source terminal is configured to have the same voltage level as at the second drain terminal.

2. The output driver circuit of claim 1, further comprising:
   an over-current detecting circuit including a tenth MOSFET having a tenth drain terminal coupled to a ninth drain terminal of the ninth MOSFET, a tenth gate terminal coupled to a predetermined voltage and a tenth source terminal coupled to the second potential; and
   a drive limiting circuit including an eleventh MOSFET having an eleventh drain terminal coupled to the first gate terminal of the first MOSFET, an eleventh gate terminal coupled to the tenth drain terminal and a eleventh source terminal coupled to the second potential,
   wherein the eleventh MOSFET operates to limit the output current flowing through the output terminal.

3. The output driver circuit of claim 1, further comprising an impedance adjustment circuit to adjust an output impedance to an operational amplifier, the impedance adjustment circuit comprising:
   a feedback resistance (Rf) having a first Rf terminal and a second Rf terminal, the first Rf terminal coupled to the output terminal and the second Rf terminal coupled to the first input of the operational amplifier;
   a feedback output node where the second Rf terminal is coupled to the ninth drain terminal of the ninth MOSFET;
   a predetermined voltage bias potential coupled to the second input of the operational amplifier; and
   a current generator coupled to the feedback output node, wherein the output impedance is based upon a value of the feedback resistance.

4. The circuit of claim 3, wherein the output impedance is determined by the ratio of Rf divided by 1+B, where B is a geometric ratio (Width/Length) of the first MOSFET to the eighth MOSFET.

5. A circuit for indirectly sensing a current at an output terminal, comprising:
   an output transistor coupled to the output terminal;
   a first replicating circuit coupled to the output transistor and configured to replicate a current flowing through the output transistor, wherein the first replicating circuit includes:
      a replicating transistor having a source terminal, a gate terminal, and a drain terminal coupled to a source terminal, a gate terminal, and a drain terminal of the output transistor, respectively; and
      a biasing circuit configured to bias the replicating transistor such that the current flowing through the replicating transistor is proportional to the current flowing through the output transistor; and
   a second replicating circuit coupled to the first replicating circuit and configured to provide a sensed current proportional to the current flowing through the replicating transistor.

6. The circuit of claim 5, wherein the output transistor has a first current-flowing terminal coupled to a first potential, a second current-flowing terminal coupled to the output terminal, and a gate terminal coupled to receive an output signal.

7. The circuit of claim 6, wherein the biasing circuit includes:
   a diode-connected transistor coupled in series with the replicating transistor;
   a biasing transistor coupled in series between the diode-connected transistor and a first potential; and
   a current mirror configured to bias the biasing transistor with a current substantially equal to the current flowing through the replicating transistor.

8. The circuit of claim 7, wherein the current mirror includes:
   a first transistor, a second transistor, and a third transistor coupled in series between the first potential and a second potential,
   wherein a gate terminal of the first transistor is coupled to a gate terminal of the replicating transistor, a gate terminal of the second transistor is coupled to a gate terminal of the diode-connected transistor, and a gate terminal of the third transistor is coupled to a gate terminal of the biasing transistor and to a current-flowing terminal of the third transistor.

9. The circuit of claim 7, wherein the current mirror is a cascode current mirror.

10. The circuit of claim 5, wherein the biasing circuit includes:
    a diode-connected transistor coupled in series with the replicating transistor;
    a first transistor and a second transistor coupled in series between the diode-connected transistor and a second potential;
    a third transistor, a fourth transistor, a fifth transistor, and a sixth transistor coupled in series between the first potential and the second potential; and
    a seventh transistor, an eighth transistor, a ninth transistor, and a tenth transistor coupled in series between the first potential and the second potential;
    wherein respective gate terminals of the third and seventh transistors are coupled to a gate terminal of the replicating transistor; respective gate terminals of the diode-connected transistor, fourth transistor and eight transistor are coupled to each other; respective gate terminals of the first fifth, sixth, and ninth transistors are coupled to each other; and respective gate terminals of the second and tenth transistors are coupled to each other.

11. The circuit of claim 5, wherein the second replicating circuit includes:
    a first transistor and a second transistor serially coupled between the first potential and a sensing node, the first transistor having a gate terminal coupled to a gate terminal of the replicating transistor, wherein the sensed current is provided at the sensing node.

12. The circuit of claim 5, further comprising:
    a feedback circuit configured to adjust an output impedance of the output terminal.

13. The circuit of claim 5, comprising:
    an over-current detecting circuit coupled to the second replicating circuit and configured to generate an over-current signal in response to the sensed current; and
    a drive-limiting circuit coupled between the over-current detecting circuit and the output transistor and configured to limit the current flowing through the output transistor in response to the over-current signal.

* * * * *